United States Patent
Takeuchi et al.

(10) Patent No.: US 12,182,338 B2
(45) Date of Patent: Dec. 31, 2024

(54) KEY MATRIX CIRCUIT DEVICE AND INPUT DEVICE

(71) Applicant: Alps Alpine Co., Ltd., Tokyo (JP)

(72) Inventors: Genki Takeuchi, Miyagi-ken (JP);
Tetsuro Kobayashi, Miyagi-ken (JP)

(73) Assignee: Alps Alpine Co., Ltd. (JP)

(*) Notice: Subject to any disclaimer, the term of this patent is extended or adjusted under 35 U.S.C. 154(b) by 70 days.

(21) Appl. No.: 18/302,448

(22) Filed: Apr. 18, 2023

(65) Prior Publication Data

US 2023/0259218 A1 Aug. 17, 2023

Related U.S. Application Data

(63) Continuation of application No. PCT/JP2021/043485, filed on Nov. 26, 2021.

(30) Foreign Application Priority Data

Dec. 22, 2020 (JP) .................................. 2020-212587

(51) Int. Cl.
*G05F 3/02* (2006.01)
*G05F 1/46* (2006.01)
(Continued)

(52) U.S. Cl.
CPC .............. *G06F 3/0202* (2013.01); *G05F 1/46* (2013.01); *H03K 17/56* (2013.01); *H03K 19/20* (2013.01)

(58) Field of Classification Search
CPC ...... H03K 19/20; H03K 17/56; G06F 3/0202; G05F 1/46
See application file for complete search history.

(56) References Cited

U.S. PATENT DOCUMENTS

| 2002/0036520 A1 | 3/2002 | Tanaka |
| 2008/0005364 A1* | 1/2008 | Naoi ................. G06F 3/0227 710/6 |
| 2011/0106985 A1* | 5/2011 | Okamoto ........... H03M 11/20 710/16 |

FOREIGN PATENT DOCUMENTS

| JP | 2002-108519 A | 4/2002 |
| JP | 2008-265633 A | 11/2008 |
| JP | 2010-282253 A | 12/2010 |

OTHER PUBLICATIONS

English translation of the International Search Report issued in the corresponding International Application No. PCT/JP2021/043485; dated Jan. 25, 2022 (total 2 pages).

* cited by examiner

*Primary Examiner* — Quan Tra
(74) *Attorney, Agent, or Firm* — Harness, Dickey & Pierce, P.L.C.

(57) ABSTRACT

A key matrix circuit device includes a key matrix having scan terminals, sense terminals, switches arranged in a matrix, and voltage dividing resistors connected between the sense terminals and the switches, and a wake-up circuit having an output terminal outputting a switch signal causing a switch unit to switch a mode of an information processing apparatus to a power-saving mode or a normal mode, a power source terminal connected to a power source, and a connection terminal connected to the power source terminal and the scan terminals. The voltage dividing resistors have resistance values that make voltages of the sense terminals to a predetermined voltage or less. The wake-up circuit outputs a switch signal to switch the mode to the normal mode when at least one of the switches is turned on and a potential of the connection terminal is brought into a first level in the power-saving mode.

11 Claims, 6 Drawing Sheets

(51) Int. Cl.
*G06F 3/02* (2006.01)
*H03K 17/56* (2006.01)
*H03K 19/20* (2006.01)

FIG. 6

| | STATUS SIGNAL | WAKE-UP PREPARATION SIGNAL | SWITCH SIGNAL |
|---|---|---|---|
| SLEEP MODE | L | H | H |
| TRANSITION | L | L | L |
| NORMAL MODE | H | L | L |

| | FIRST TRANSISTOR | SECOND TRANSISTOR | THIRD TRANSISTOR |
|---|---|---|---|
| SLEEP MODE | OFF | OFF | OFF |
| TRANSITION | OFF | ON | ON |
| NORMAL MODE | ON | ON | ON |

KEY MATRIX CIRCUIT DEVICE AND INPUT DEVICE

CLAIM OF PRIORITY

This application is a Continuation of International Application No. PCT/JP2021/043485 filed on Nov. 26, 2021, which claims benefit of Japanese Patent Application No. 2020-212587 filed on Dec. 22, 2020. The entire contents of each application noted above are hereby incorporated by reference.

BACKGROUND OF THE INVENTION

1. Field of the Invention

The present invention relates to a key matrix circuit device and an input device.

2. Description of the Related Art

In general, a key matrix circuit includes a first power source that does not supply power in a sleep mode, a second power source that always supplies power, switches arranged in a matrix, a plurality of first circuit elements on a scan side, a plurality of second circuit elements on a sensing side, a third circuit element that supplies current from the sensing side to the scan side in the sleep mode, and a fourth circuit element that outputs a wake-up signal in response to a press of a switch in the sleep mode. The second power source constantly supplies electric power to the third circuit element, and a voltage is supplied from the third circuit element to the plurality of second circuit elements on the sensing side in accordance with the second power source (refer to Japanese Unexamined Patent Application Publication No. 2010-282253, for example).

General key matrix circuits are used in operation panels of image forming apparatuses, such as printers. The second circuit element on the sensing side is configured by an integrated circuit (IC), and therefore, an input voltage is limited to approximately +5V. Therefore, a voltage applied from the third circuit element to the second circuit element is regarded as approximately +5V which can be input to the IC. This is because the input voltage of the IC has an upper limit to suppress damage on the IC.

Here, the key matrix circuits may be used in environments where a power source voltage is higher than an upper limit voltage that may be input to an information processing apparatus, such as the IC. For example, batteries installed in vehicles have output voltages of 12V, 24V, etc.

SUMMARY OF THE INVENTION

The present invention provides a key matrix circuit device and an input device that are capable of using a power source voltage higher than the upper limit voltage that may be input to the information processing apparatus as it is.

According to an aspect of the present invention, a key matrix circuit device includes a key matrix having a plurality of scan terminals, a plurality of sense terminals, a plurality of switches that are connected between the plurality of scan terminals and the plurality of sense terminals and that are arranged in a matrix, and a plurality of voltage dividing resistors connected between the plurality of sense terminals and the plurality of switches, and a wake-up circuit having an output terminal that outputs a switch signal that causes a switch unit to switch a mode of an information processing apparatus to a power-saving mode or a normal mode, a power source terminal connected to a power source, and a connection terminal connected to the power source terminal and the plurality of scan terminals. The plurality of voltage dividing resistors have respective resistance values that make voltages of the plurality of sense terminals connected to respective sense ports of the information processing apparatus to a predetermined voltage or less. The wake-up circuit outputs a switch signal from the output terminal to switch the mode to the normal mode when at least one of the plurality of switches is turned on and a potential of the connection terminal is brought into a first level while the information processing apparatus is in the power-saving mode.

BRIEF DESCRIPTION OF THE DRAWINGS

FIG. 6 is a diagram illustrating statuses of a status signal, a wake-up preparation signal, a switch signal, a first transistor, a second transistor, and a third transistor in a sleep mode, in transition, and in a normal mode.

DESCRIPTION OF THE PREFERRED EMBODIMENTS

The following describes an embodiment of a key matrix circuit device and an input device of the present invention.

EMBODIMENT

Figure 1:
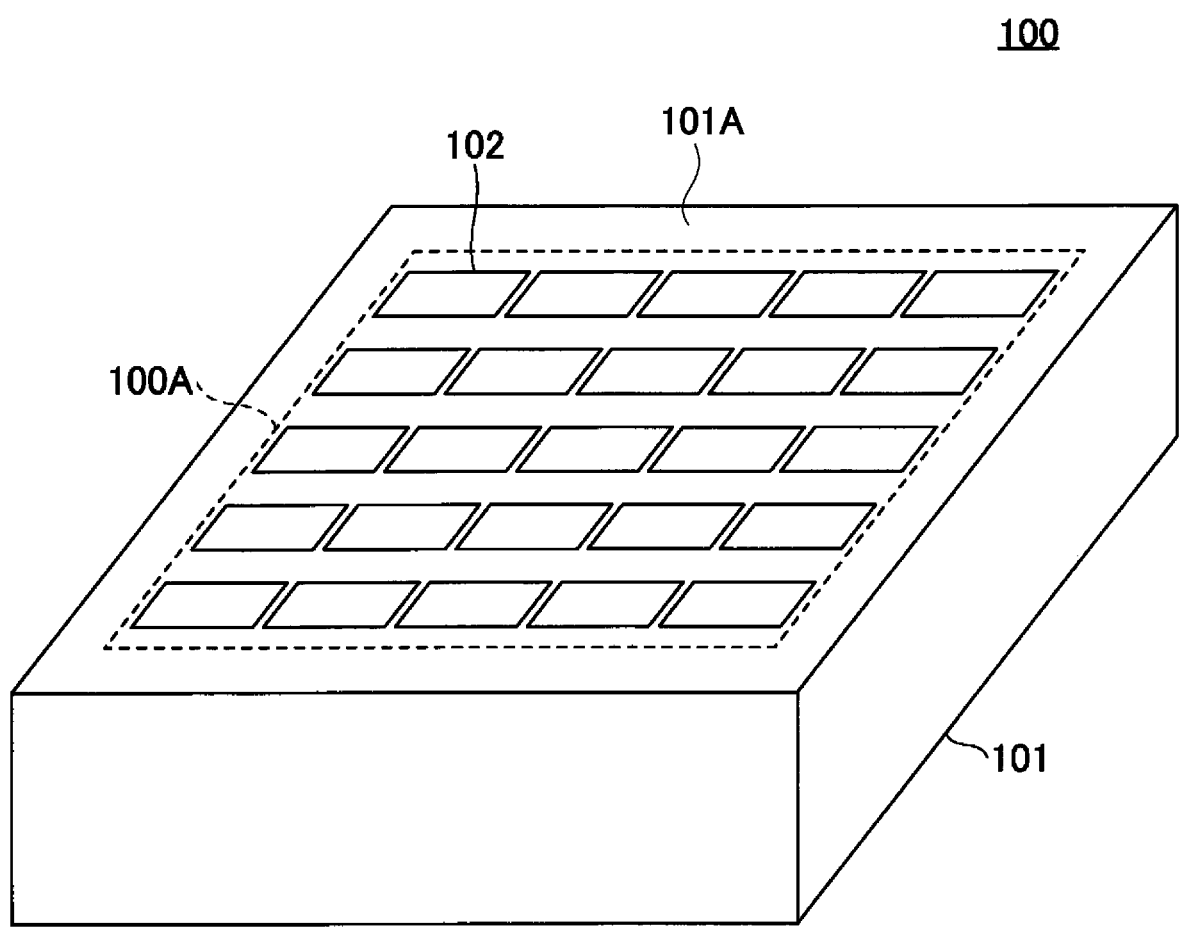
FIG. 1 is a diagram illustrating an input device according to an embodiment.

FIG. 1 is a diagram illustrating an input device 100 according to the embodiment. The input device 100 is installed in a vehicle, for example, and allows a user of the vehicle to operate devices installed in the vehicle. The devices installed in the vehicle are, for example, an air conditioner and an audio system, and in this case, the input device 100 is used as an operation device for the air conditioner and the audio system. The vehicle includes a power source (e.g., a battery) in which a power source voltage is higher than an upper limit voltage that can be input to an information processing apparatus, such as a microcomputer. Note that, although the form in which the input device 100 is installed in the vehicle is described here, the input device 100 may be installed not only in vehicles but also in aircraft, trains, and the like as long as the input device 100 has a power source in which a power source voltage is higher than the upper limit voltage that can be input to the information processing apparatus.

The input device 100 includes a housing 101, a plurality of operation units 102, and a key matrix circuit device 100A. The housing 101 is installed in a center console, a dashboard, etc., in an interior of a vehicle, as an example. A top surface of the housing 101 in FIG. 1 is an operation panel 101A on which the plurality of operation units 102 are arranged. Each of the operation units 102 is a switch capable of operating turning on/off of the air conditioner, the audio system, etc., a temperature setting, an airflow setting, an air vent setting, a volume setting, a radio music selection, and the like.

The key matrix circuit device 100A is disposed on back sides of the operation units 102 (inside the housing 101). The key matrix circuit device 100A has a key matrix, and a plurality of switches in the key matrix are disposed on the back sides of the operation units 102. When each of the operation units 102 is pressed, a switch of the key matrix located on the back side is turned on.

Figure 2:
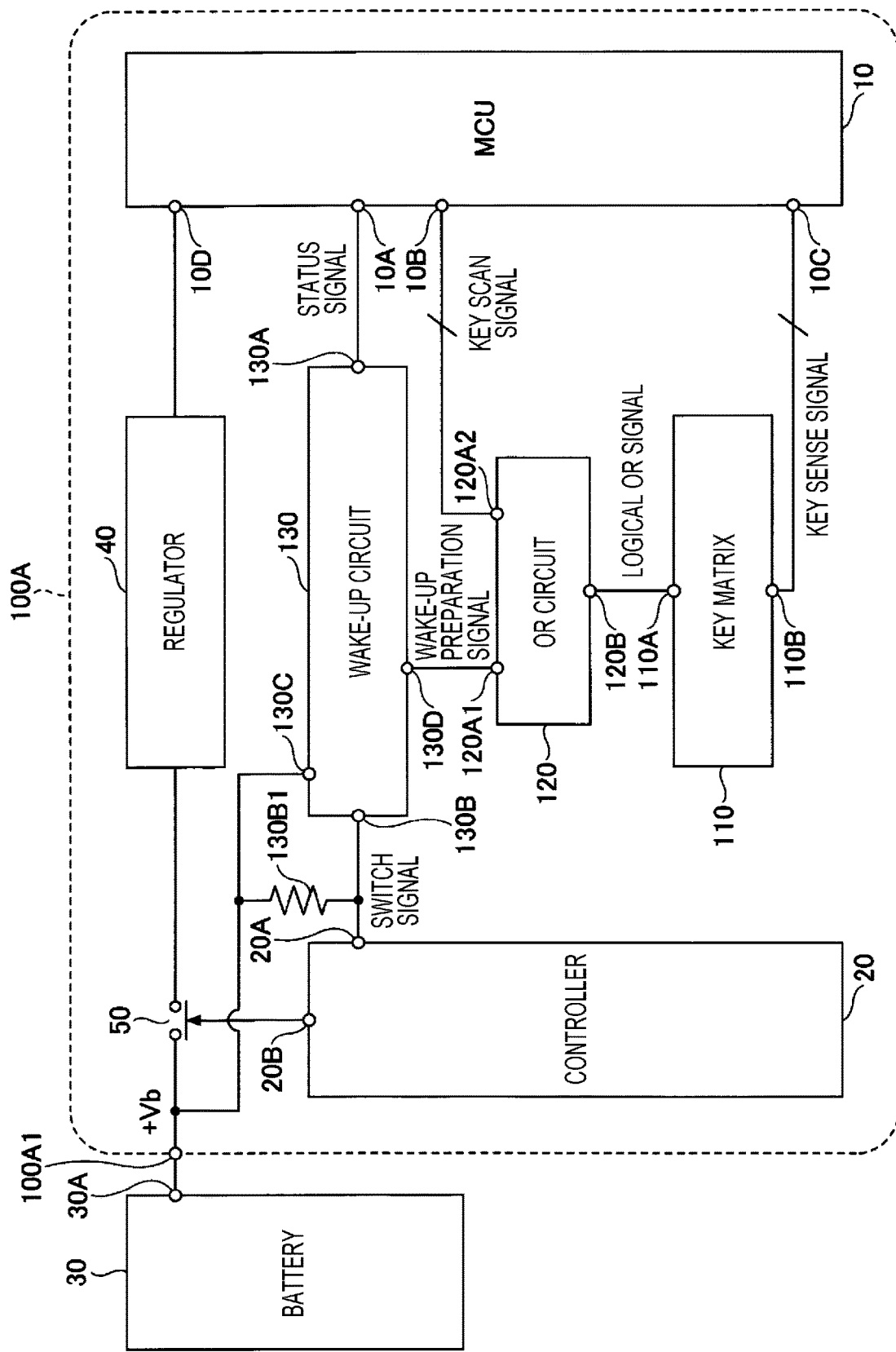
FIG. 2 is a diagram illustrating a key matrix circuit device.

FIG. 2 is a diagram illustrating the key matrix circuit device 100A. In FIG. 2, individual components are illustrated as simplified blocks. The key matrix circuit device 100A includes a micro computer unit (MCU) 10, a controller 20, a regulator 40, a power source switch 50, a battery terminal 100A1, a key matrix 110, an OR circuit 120, and a wake-up circuit 130. The MCU 10 is an example of an information processing apparatus. The controller 20 is an example of a switch unit. A battery 30 is an example of a power source. The regulator 40 is an example of a voltage converter. The OR circuit 120 is an example of a logical OR circuit. Although one OR circuit 120 is illustrated in FIG. 2, a plurality of OR circuits are disposed in practice. Furthermore, in FIG. 2, the battery 30 connected to the battery terminal 100A1 is illustrated in addition to the key matrix circuit device 100A.

The MCU 10 is a controller that performs a scan (key scan) to detect connection statuses (on or off) of all the switches in the key matrix 110 and identifies switches that have been turned on in a normal mode. The MCU 10 has an output port 10A, a plurality of scan ports 10B, a plurality of sense ports 10C, and a power source terminal 10D. The MCU10 outputs a status signal from the output port 10A. The status signal indicates whether a mode of the MCU10 is the normal mode or a sleep mode. A low (L) level of the status signal indicates that the MCU10 is in the sleep mode, while a high (H) level indicates that the MCU10 is in the normal mode.

The normal mode corresponds to a state in which the sleep mode is canceled and the MCU10 is capable of performing various types of information processing. The sleep mode is an example of a power-saving mode in which operation of the MCU10 is limited so that the MCU 10 enters a power-saving state, and the MCU 10 waits for startup. The L level is an example of a first level, and the H level is an example of a second level. When the MCU 10 enters the normal mode from the sleep mode, the status signal output from the output port 10A is set to the H level.

The MCU 10 outputs key scan signals from the plurality of scan ports 10B in sequence to perform a scan (key scan) to detect connection statuses (on or off) of all the switches in the key matrix 110. By the scan, switches that are turned on may be detected in the key matrix 110. Furthermore, the plurality of sense ports 10C receive key sense signals input thereto representing detection results in the scan from the key matrix 110, and the MCU 10 identifies the switches that are turned on based on combinations of the key scan signals and the key sense signals. The power source terminal 10D receives DC power supplied thereto converted to a lower voltage, such as +5V or +3.3V, by the regulator 40.

The controller 20 has an input terminal 20A and an output terminal 20B. When an L-level switch signal is input to the input terminal 20A from an output terminal 130B of the wake-up circuit 130, a drive signal is output from the output terminal 20B to turn on the power source switch 50. When the power source switch 50 is turned on, a power source voltage +Vb of the battery 30 is supplied to the regulator 40, and a low-voltage DC power converted by the regulator 40, such as +5V or +3.3V, is supplied to the power source terminal 10D of the MCU10 so that the MCU10 is switched from the sleep mode to the normal mode. The controller 20 outputs a drive signal to turn on the power source switch 50 in response to the L-level switch signal, and outputs a drive signal to turn off the power source switch 50 in response to an H-level switch signal. Note that the controller 20 may have functions other than those described here, and may be a CAN transceiver used in a CAN (Controller Area Network) installed in a vehicle, but descriptions are omitted here except for the function of turning the power source switch 50 on.

The battery 30 is for a vehicle and outputs DC power of 12V as an example. The output terminal 30A of the battery 30 is connected via the battery terminal 100A1 to the power source switch 50 and a power source terminal 130C of the wake-up circuit 130, and supplies a power source voltage +Vb of the battery 30. The power source voltage +Vb of the battery 30 is supplied to an output terminal 130B of the wake-up circuit 130 via a pull-up resistor 130B1. The regulator 40 is disposed between the battery 30 and the MCU 10, converts the power source voltage +Vb (+12V) of the battery 30 to a lower voltage, such as +5V or +3.3V, and outputs the resultant voltage to the MCU 10. The power source switch 50 is provided in series between the output terminal 30A of the battery 30 and an input terminal of the regulator 40, and is switched on and off by a drive signal output from the output terminal 20B of the controller 20.

The key matrix 110 is connected to the OR circuit 120 and the MCU 10, and has a plurality of scan terminals 110A, a plurality of sense terminals 110B, a plurality of switches arranged in a matrix, and a plurality of voltage dividing resistors connected respectively between the plurality of sense terminals 110B and the plurality of switches. Since the key matrix 110 is described in detail below with reference to FIG. 3, the switches and the voltage dividing resistors are omitted in FIG. 2, and one scan terminal 110A and one sense terminal 110B are shown. The plurality of switches are connected between the plurality of scan terminals 110A and the plurality of sense terminals 110B and arranged in a matrix. The plurality of scan terminals 110A are actually connected to corresponding logical OR output terminals 120B of the plurality of OR circuits 120, and the plurality of sense terminals 110B are connected to the plurality of corresponding sense ports 10C of the MCU 10.

The key matrix 110 operates in conjunction with the OR circuits 120 and the wake-up circuit 130 to generate a wake-up preparation signal when at least one of the switches is turned on while the MCU 10 is in the sleep mode. The wake-up preparation signal is output from a connection terminal 130D of the wake-up circuit 130. In the key matrix 110, a scan (key scan) is performed to detect connection statuses (on or off) of the individual switches by inputting key scan signals from the plurality of scan ports 10B of the MCU 10 via the OR circuits 120 when the MCU 10 is in the normal mode. Key sense signals representing results of the scan on the key matrix 110 are input from the sense terminals 110B to the plurality of sense ports 10C of the MCU 10.

There are actually the plurality of OR circuits 120, which are arranged in parallel between the key matrix 110 and the wake-up circuit 130. Each of the OR circuits 120 has one input terminal 120A1, one input terminal 120A2, and one logical OR output terminal 120B. The input terminal 120A1 is a first input terminal and the input terminal 120A2 is a second input terminal. Since there are actually the plurality of OR circuit 120, it is assumed that there are plurality of input terminals 120A1, a plurality of input terminals 120A2, and a plurality of logical OR output terminals 120B. The plurality of input terminals 120A1 are connected to the single connection terminal 130D of the wake-up circuit 130, and the plurality of input terminals 120A2 are connected to the respective scan ports 10B of the MCU 10. Each of the OR circuits 120 outputs, from the logical OR output terminal 120B, a signal representing a logical OR of signals input to the input terminals 120A1 and 120A2.

The wake-up circuit 130 has an input terminal 130A, the output terminal 130B, the power source terminal 130C, and the connection terminal 130D. The input terminal 130A is connected to the output port 10A of the MCU10, and receives a status signal output from the output port 10A.

The output terminal 130B is connected to the input terminal 20A of the controller 20 and the output terminal 30A of the battery 30 via the pull-up resistor 130B1 to output a switch signal to switch a mode of the MCU10.

The power source terminal 130C is connected to the output terminal 30A of the battery 30. DC power of +12V, which is the power source voltage +Vb of the battery 30 as an example, is input to the power source terminal 130C. The connection terminal 130D is connected to the input terminals 120A1 of the OR circuits 120.

When the MCU 10 is in the sleep mode and at least one of the switches in the key matrix 110 is turned on, the wake-up circuit 130 operates in conjunction with the key matrix 110 and the OR circuits 120 to generate a wake-up preparation signal. The wake-up circuit 130 outputs the wake-up preparation signal from the connection terminal 130D. When generating the wake-up preparation signal, the wake-up circuit 130 outputs an L-level switch signal from the output terminal 130B to the controller 20. As a result, the controller 20 turns on the power source switch 50, DC power of the power source voltage +Vb supplied from the battery 30 is converted by the regulator 40 to low-voltage DC power, such as +5V or +3.3V, and supplied to the power source terminal 10D of the MCU10, and the MCU10 enters the normal mode. That is, the L-level switch signal is a wake-up signal that activates the MCU10 in the normal mode. The wake-up preparation signal is generated by the wake-up circuit 130 in a preparation stage for outputting the wake-up signal.

Figure 3:
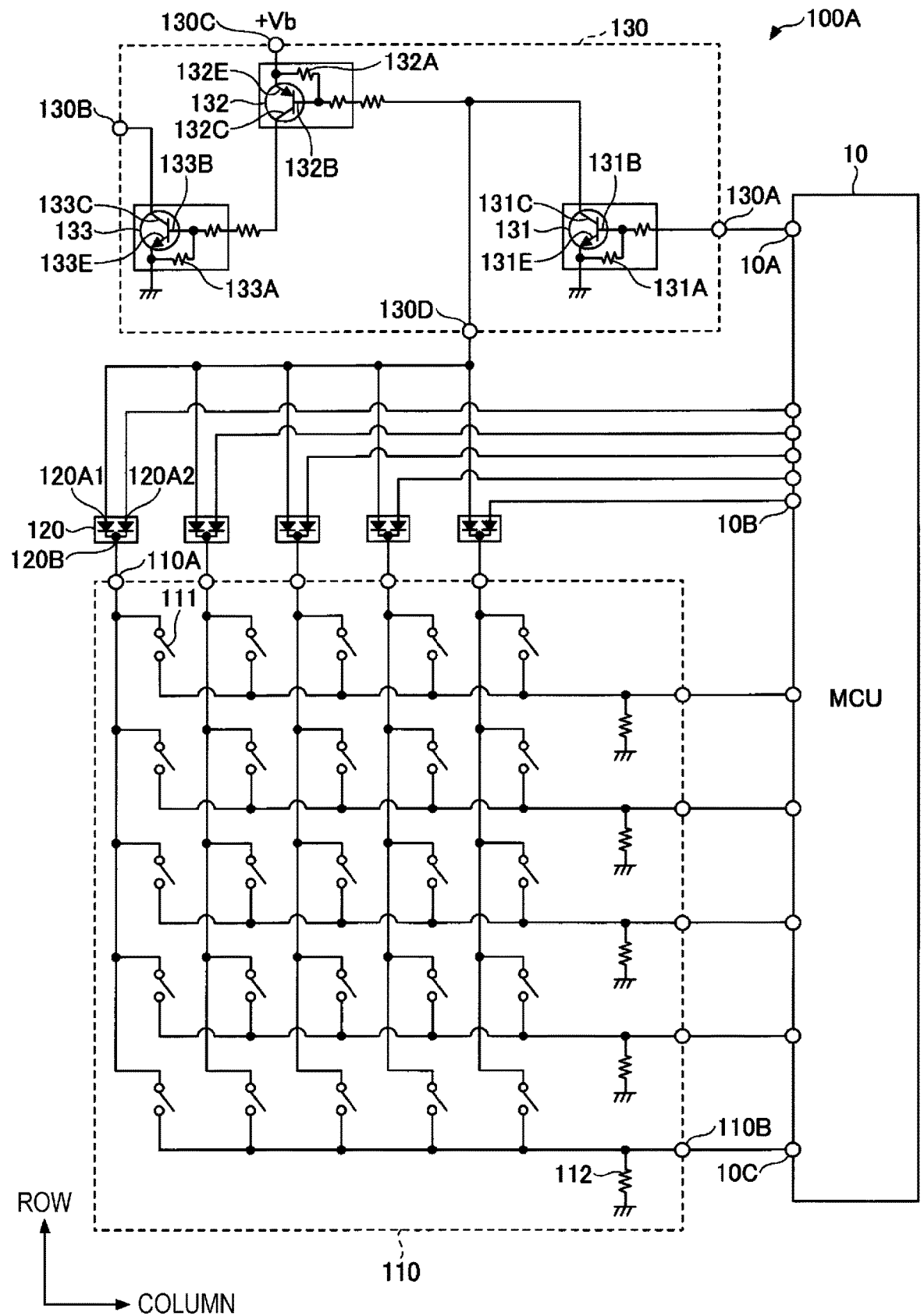
FIG. 3 is a diagram illustrating an example of a circuit structure of the key matrix circuit device in detail.

FIG. 3 is a diagram illustrating an example of a detailed circuit configuration of the key matrix circuit device 100A. In FIG. 3, the controller 20, the regulator 40, the power source switch 50, and so on are omitted. The key matrix 110 of the key matrix circuit device 100A illustrated in FIG. 3 has, as an example, five scan terminals 110A, five sense terminals 110B, and 25 switches 111.

The five scan terminals 110A are connected to the five corresponding scan ports 10B of the MCU 10. The five sense terminals 110B are connected to the five corresponding sense ports 10C of the MCU 10. The power source terminal 10D is omitted in FIG. 3.

Figure 4:
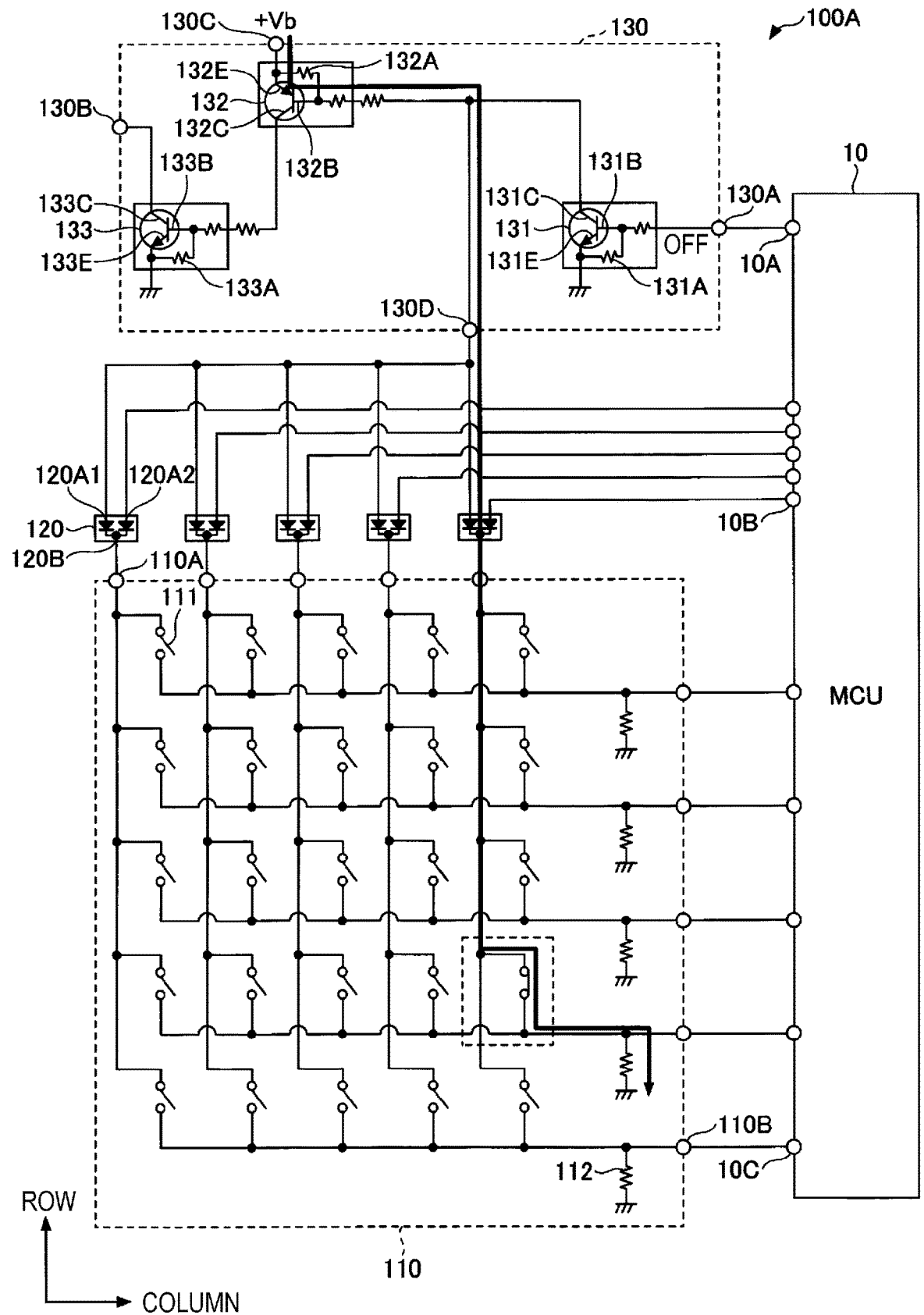
FIG. 4 is a diagram illustrating an operation of the key matrix circuit device.

For the 25 switches 111, a vertical sequence is referred to as columns and a horizontal sequence is referred to as rows in FIG. 3. The five switches 111 connected to one of five corresponding lines extending downward from the five OR circuits 120 are included in the same column. A direction of extension of the columns is longitudinal in FIG. 3. The five switches 111 connected to each of five lines extending laterally from the five sense ports 10C of the MCU10 are included in the same row. A direction of extension of the rows is transverse in FIG. 3. As illustrated in FIG. 4, one of the switches 111 enclosed by a dashed line is located in a fourth row and a fifth column as an example.

The key matrix 110 of the key matrix circuit device 100A shown in FIG. 3 further includes five voltage dividing resistors 112. The five voltage dividing resistors 112 are inserted in series, in the individual rows, on lines branching from portions between the five switches 111 and the sense terminals 110B to ground. The ground is an example of a reference potential point. A resistance value of the voltage dividing resistors 112 is set such that, when the MCU10 is in the sleep mode, a first transistor 131 of the wake-up circuit 130 is in an off state, as an example, the switch 111 located in the fifth column of the fourth row is turned on, and a second transistor is turned on, a voltage applied to one of the sense ports 10C corresponding to the fourth row becomes equal to or smaller than the upper limit voltage (+5V, for example) that may be input to the MCU 10. Note that, when any of the switches 111 is turned on, the voltage applied to the corresponding one of the sense ports 10C is equal to or smaller than the upper limit voltage (+5V as an example) that may be input to the MCU10. The upper limit voltage that may be input to the MCU 10 is an example of a predetermined voltage, and the resistance value that falls below the upper limit voltage that may be input to the MCU 10 is an example of a resistance value that falls below the predetermined voltage that may be input to the MCU 10.

The number of OR circuits 120 is the same as the number of columns in the key matrix 110, and therefore, five OR circuits 120 are provided in FIG. 3. Each of the OR circuits 120 has two diodes as an example. An anode of one of the two diodes (a left diode in FIG. 3) is the input terminal 120A1. The five input terminals 120A1 are connected to the (single) connection terminal 130D of the wake-up circuit 130. An anode of the other of the two diodes (a right diode in FIG. 3) is the input terminal 120A2. The five input terminals 120A2 are connected to the five respective scan ports 10B of the MCU10.

In each of the OR circuits 120, cathodes of the two diodes are connected to each other to become the logical OR output terminal 120B. The five logical OR output terminals 120B are connected to the five corresponding scan terminals 110A.

The wake-up circuit 130 includes the first transistor 131, a first resistor 131A, a second transistor 132, a second resistor 132A, a third transistor 133, and a third resistor 133A. The second resistor 132A is an example of a pull-up resistor.

The first transistor 131 is an NPN type transistor having a collector 131C, an emitter 131E, and a base 131B, and is turned on when the base 131B is brought into the H level. The collector 131C, the emitter 131E, and the base 131B are examples of a first current input terminal, a first current output terminal, and a first control terminal, respectively. The first resistor 131A is connected between the emitter 131E and the base 131B to ensure that the first transistor 131 is turned off by lowering the base 131B to a ground level when a status signal output from the output port 10A is at the L level.

The collector 131C is connected to the connection terminal 130D and a base 132B of the second transistor 132. The emitter 131E is connected to the ground. The base 131B is connected to the output port 10A of the MCU10. Therefore, the first transistor 131 is in the off state when the MCU 10 is in the sleep mode and a status signal input to the base 131B from the output port 10A is in the L level. The first transistor 131 is turned on when the MCU 10 is in the normal mode and a status signal input to the base 131B from the output port 10A is at the H level.

The second transistor 132 is a PNP type transistor having an emitter 132E, a collector 132C, and a base 132B, and is turned on when the base 132B is brought into the L level. The emitter 132E, the collector 132C, and the base 132B are examples of a second current input terminal, a second current output terminal, and a second control terminal, respectively. The second resistor 132A is connected between the emitter 132E and the base 132B.

The emitter 132E is connected to the power source terminal 130C of the wake-up circuit 130 and is connected to the battery 30 (refer to FIG. 2) via the power source terminal 130C. The collector 132C is connected to the base 133B of the third transistor 133. The base 132B is connected to the connection terminal 130D and the collector 131C of the first transistor 131. When the MCU 10 is in the sleep mode and no operation is being performed on the key matrix 110, the base 132B is pulled up to the power source voltage +Vb of the battery 30 since the power source voltage +Vb is supplied to the base 132B through the second resistor 132A, and therefore, the base 132B is brought into the H level and turned off in the second transistor 132. When at least one of the switches 111 of the key matrix 110 is operated to be turned on while the MCU 10 is in the sleep mode, the second transistor 132 is connected to the ground via the switch 111 that has been turned on, and therefore, the base 132B is brought into the L level and is turned on. Furthermore, the second transistor 132 is turned on when the MCU 10 is in the normal mode. These operations are described below with reference to FIGS. 4 and 5.

The third transistor 133 is an NPN type transistor having a collector 133C, an emitter 133E, and a base 133B, and is turned on when the base 133B is brought into the H level. The collector 133C, the emitter 133E, and the base 133B are examples of a third current input terminal, a third current output terminal, and a third control terminal, respectively. The third resistor 133A is connected between the emitter 133E and the base 133B to ensure that the third transistor 133 is securely turned off by lowering the base 133B to the ground level when the base 133B is in the L level.

The collector 133C is connected to the output terminal 130B of the wake-up circuit 130. The base 133B is connected to the collector 132C of the second transistor 132. The emitter 133E is connected to the ground. The third transistor 133 is turned on when the second transistor 132 is turned on and power is supplied from the battery 30 via the second transistor 132 so that the base 133B is brought into the H level. The third transistor 133 is turned off when the second transistor 132 is off, because the base 133B is brought into the L level. Specifically, the third transistor 133 switches on and off in conjunction with on and off of the second transistor 132.

Figure 5:
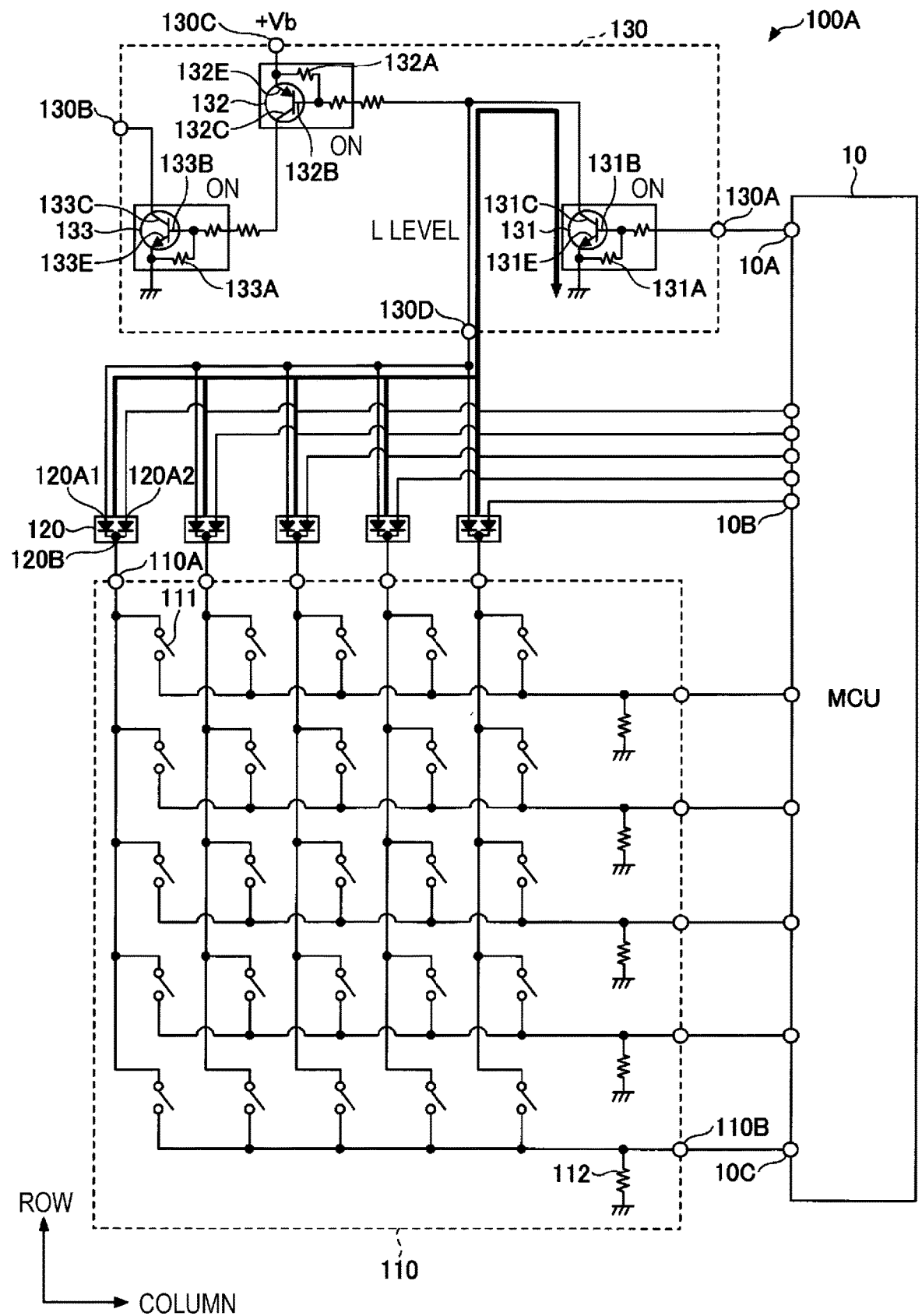
FIG. 5 is a diagram illustrating an operation of the key matrix circuit device.

Next, the operation of the key matrix circuit device 100A is described with reference to FIGS. 4 and 5 in addition to FIG. 3. FIGS. 4 and 5 are diagrams illustrating an operation of the key matrix circuit device 100A. An operation of the key matrix circuit device 100A during transition of the MCU 10 from the sleep mode to the normal mode is illustrated in FIG. 4, and an operation of the key matrix circuit device 100A when the MCU 10 is in the normal mode is illustrated in FIG. 5. First, the case where the MCU 10 is in the sleep mode will be described with reference to FIG. 3.

When the MCU10 is in the sleep mode, as shown in FIG. 3, no operation is performed on any of the switches 111 in the key matrix 110, and all the switches 111 are off, the power source voltage +Vb of the battery 30 is supplied through the second resistor 132A so that the base 132B is brought into the H level. Therefore, the second transistor 132 is in the off state. Since the second transistor 132 is in the off state, the third transistor 133 is also in the off state, and the switch signal output from the output terminal 130B is at the H level. Since the output terminal 130B is connected to the battery 30 via the pull-up resistor 130B1 (refer to FIG. 2) and the third transistor 133 is in the off state, a voltage obtained by subtracting a voltage drop of the pull-up resistor 130B1 (refer to FIG. 2) from the supply voltage +Vb of the battery 30 is generated as a H-level signal at the output terminal 130B. In this state, the switching signal is in the H level, and therefore, the MCU10 remains in the sleep mode.

Next, in the transition shown in FIG. 4, when the MCU10 is in the sleep mode and the switch 111 in the fifth column of the fourth row, enclosed by the dashed line as an example, is pressed and turned on, the switch 111 that has been turned on is connected to the ground, and therefore, a potential of the base 132B of the second transistor 132 decreases to the L level so that the second transistor 132 to turned on. When the second transistor 132 is turned on, the third transistor 133 is also turned on. When the third transistor 133 is turned on, the output terminal 130B is connected to the ground through the collector 133C and the emitter 133E of the turned-on third transistor 133, and therefore, the output terminal 130B is brought into the L level.

When the output terminal 130B is brought into the L level, the controller 20 turns on the power source switch 50, and therefore, low-voltage power, such as +5V or +3.3V, is supplied from the regulator 40 to the power source terminal 10D of the MCU10, and the MCU10 is waken up and enters the normal mode. The MCU10 sets the status signal output from output port 10A to the H level in the normal mode.

When the MCU10 enters the normal mode and the status signal output from the output port 10A is brought into the H level, the first transistor 131 is turned on as shown in FIG. 5. When the first transistor 131 is turned on, since the emitter 131E is connected to the ground, the connection terminal 130D is brought into the L level, the base 132B of the second transistor 132 is brought into the L level, and the second transistor 132 is turned on. When the second transistor 132 is turned on, the third transistor 133 is also turned on. Therefore, all the first transistor 131, the second transistor 132, and the third transistor 133 are turned on.

When the connection terminal 130D is brought into the L level, the L level is input to the input terminals 120A1 of the five OR circuits 120, and therefore, levels of outputs of the plurality of scan ports 10B of the MCU10 are reflected in the logical OR output terminals 120B of the five OR circuits 120. Therefore, by outputting H-level key-scan signals from the plurality of scan ports 10B in sequence, the five columns of the key matrix 110 can be brought into the H level in sequence and the key matrix 110 may be scanned.

FIG. 6 is a diagram illustrating states of the status signal, the wake-up preparation signal, the switch signal, the first transistor, the second transistor, and the third transistor in the sleep mode, in the transition, and in the normal mode. As shown in the table above, in the sleep mode, the status signal, the wake-up preparation signal, and the switch signal are in the L, H, and H levels, respectively. Furthermore, in the transition, the status signal, the wake-up preparation signal, and the switch signal are in the L, L, and H levels, respectively. In the normal mode, the status signal, the wake-up preparation signal, and the switch signal are in the H, L, and L levels, respectively. When one of the switches 111 is turned on in the sleep mode and the transition is entered, the wake-up preparation signal is brought into the L level and the switch signal changes to the L level so that the normal mode is entered.

As shown in a table below, the first transistor 131, the second transistor 132, and the third transistor 133 are all in the off state in the sleep mode, are in the off state, the on state, and the on state, respectively, in the transition, and are all in the on state in the normal mode. When one of the switches 111 is turned on in the sleep mode and the transition is entered, the second transistor 132 is turned on and then the third transistor 133 is turned on so that the switch signal is brought into the L level and the normal mode is entered. The second transistor 132 and the third transistor 133 are turned on or off in conjunction with each other.

As described above, the voltage dividing resistors 112 of the key matrix 110 have respective resistance values that bring voltages of the plurality of sense terminals 110B connected to the corresponding sense ports 10C of the MCU 10 to the input upper limit voltage of the MCU 10 or lower. The wake-up circuit 130 outputs an L-level switch signal from the output terminal 130B to switch the mode of the MCU10 to the normal mode when at least one of the plurality of switches 111 is turned on and the potential of the connection terminal 130D is brought into the L level while the MCU10 is in the sleep mode.

Therefore, it is possible to provide the key matrix circuit device 100A and the input device 100 that may use the supply voltage +Vb (of the battery 30), which is higher than the upper limit voltage that may be input to the MCU 10, as it is.

Furthermore, when at least one of the plurality of switches 111 is turned on in detection of the operation of waking up the MCU 10, current flows from the battery 30 connected to the emitter 132E of the second transistor 132 through the base 132B, the connection terminal 130D, the OR circuit 120 in a column including the switch 111 that has been turned on, and the turned-on switch 111 to the ground. Then the second transistor 132 is turned on and the third transistor 133 is turned on when the base 132B is brought into the L level, and an L-level switch signal is output from the output terminal 130B to wake up the MCU10. Therefore, scan is not required to be performed on the key matrix 110 when the operation of waking up the MCU 10 is to be detected. Therefore, the key matrix circuit device 100A and the input device 100 with power-saving in detection of the operation of waking up the MCU 10 may be provided.

Furthermore, when the wake-up preparation signal output from the connection terminal 130D is brought into the L level, the power source switch 50 disposed between the regulator 40, which is connected between the battery 30 and the power source terminal 10D of the MCU 10 and converts the power source voltage to a voltage that may be input to the MCU 10, and the battery 30 becomes conductive. Therefore, power can be supplied to the MCU10 in response to the wake-up preparation signal, and therefore, the MCU10 may be waken up and shifted to the normal mode.

The key matrix circuit device 100A further includes the plurality of logical OR circuits 120 each of which includes the logical OR output terminal 120B connected to the corresponding one of the scan terminals 110A. The wake-up circuit 130 has the input terminal 130A which is connected to the MCU 10 and to which a status signal representing a mode is input, the collector 131C connected to the connection terminal 130D and the power source terminal 10D, the emitter 131E connected to the ground, and the base 131B connected to the input terminal 130A. The wake-up circuit 130 further includes the first transistor 131 that is turned on when an H-level signal is input to the base 131B. The connection terminal 130D is connected to the first input terminals 120A1 of the plurality of OR circuits 120, and the second input terminals 120A2 of the plurality of OR circuits 120 are connected to the plurality of scan ports 10B of the MCU 10. The status signal is in the H level when the MCU 10 is in the normal mode. Therefore, when the MCU 10 is in the normal mode, the first transistor 131 is turned on and the connection terminal 130D is brought into the L level, and the L-level signal is input to the first input terminals 120A1 of the plurality of OR circuits 120, so that key scan signals supplied from the plurality of scan ports 10B to the second input terminals 120A2 are reflected on the logical OR output terminals 120B of the plurality of OR circuits 120.

When the MCU 10 is switched to the normal mode by the switch signal, the first transistor 131 is turned on, and when the potential of the connection terminal 130D is lowered to the L level, the wake-up circuit 130 may scan connection statuses of the plurality of switches 111 using scan signals output from the plurality of scan ports 10B. Specifically, in a state in which the L-level signal is input to the first input terminals 120A1 of the plurality of OR circuits 120, the key matrix 110 may be scanned using the key scan signal input to the second input terminals 120A2 from the plurality of scan ports 10B.

The wake-up circuit 130 includes the emitter 132E connected to the power source terminal 10D, the collector 132C, and the base 132B connected to the connection terminal 130D and the collector 131C, and further includes the second transistor 132 that is turned on when an L-level signal is input to the base 132B and the second resistor 132A that connects the emitter 132E of the second transistor 132 to the base 132B. The connection terminal 130D is connected to the power source terminal 10D via the second transistor 132 and the second resistor 132A. Therefore, in a state in which the MCU 10 is in the sleep mode and operation is not performed on any of the switches 111, the connection terminal 130D is connected to the battery 30 via the second resistor 132A and therefore is in the H level and the second transistor 132 is in the off state. When one of the switches 111 is turned on, the connection terminal 130D is brought into the L level, and the second transistor 132 is turned on, a low level switch signal is output from the output terminal 130B to shift the MCU 10 into the normal mode.

When the MCU10 is in the sleep mode and the plurality of switches 111 are in the off state, a potential of the connection terminal 130D is in the H level. Therefore, the second transistor 132 is maintained in the off state and the sleep mode of MCU 10 is securely maintained.

When at least one of the plurality of switches 111 is turned on and the potential of the connection terminal 130D is brought into the L level while the MCU 10 is in the sleep: mode, the wake-up circuit 130 outputs a switch signal for performing switching to the normal mode by turning on the second transistor 132 from the output terminal 130B. Therefore, the second transistor 132 may be turned on to ensure that the MCU10 is wakened up and shifted to the normal mode.

Furthermore, the wake-up circuit 130 also includes the third current input terminal 133C connected to the output terminal 130B, the emitter 133E connected to the ground, and the base 133B connected to the collector 132C, and further includes the third transistor 133 that is turned on when a H-level signal is input to the base 133B. The output terminal 130B is connected to the battery 30 via the pull-up resistor 130B1, and the switch signal for performing switching to the normal mode is an L-level signal. Therefore, using the third transistor 133 that is turned on in conjunction with the second transistor 132, the switch signal may be set to the H level in the sleep mode, and when at least one of the plurality of switches 111 is turned on, the MCU 10 may be securely waken up by the L-level switch signal and may be shifted to the normal mode.

Furthermore, when the status signal is in the L level indicating the sleep mode, at least one of the plurality of switches 111 is turned on, and the L-level signal is input to the base 132B to turn on the second transistor 132, the potential of the base 133B is brought into the H level and the third transistor 133 is turned on so that the switch signal is brought into the L level. The third transistor 133, which is turned on in conjunction with the second transistor 132, may be used to reliably generate an L-level switch signal to shift the MCU 10 into the normal mode (for wake-up), and the L-level switch signal may reliably shift the MCU 10 into the normal mode.

Furthermore, in the input device 100, when the wake-up preparation signal output from the connection terminal 130D is brought into the L level, the power source switch 50 disposed between the regulator 40, which is connected between the battery 30 and the power source terminal 10D of the MCU 10 and converts the power source voltage to a voltage that may be input to the MCU 10, and the battery 30 becomes conductive. Therefore, power can be supplied to the MCU10 in response to the wake-up preparation signal, and therefore, the MCU10 may be waken up and shifted to the normal mode. Note that, although the embodiment in which the wake-up circuit 130 includes the first transistor 131, the second transistor 132, the third transistor 133, the first resistor 131A, the second resistor 132A, and the third resistor 133A has been described above, the circuit configuration of the wake-up circuit 130 is not limited to this as long as the same operation is available.

Although the embodiment in which each of the OR circuits 120 includes two diodes is described, the circuit configuration of the OR circuits 120 is not limited to the circuit configuration described above as long as each of the circuits is capable of outputting a logical OR of two inputs while maintaining a rectification action.

Although the key matrix 110 is described in the form of 5 rows by 5 columns, the key matrix 110 is not limited to such a configuration, and the number of rows and columns may be changed.

The key matrix circuit device and the input device of the exemplary embodiment of the invention have been described above. The invention is not limited to the embodiment specifically disclosed, and various modifications and changes may be made without departing from the scope of the claims.

This international application claims priority based on Japanese Patent Application No. 2020-212587 filed on Dec. 22, 2020, and the entire contents of Japanese Patent Application No. 2020-212587 are hereby incorporated herein by reference.

What is claimed is:

1. A key matrix circuit device, comprising:
  a key matrix having a plurality of scan terminals, a plurality of sense terminals, a plurality of switches that are connected between the plurality of scan terminals and the plurality of sense terminals and that are arranged in a matrix, and a plurality of voltage dividing resistors connected between the plurality of sense terminals and the plurality of switches; and
  a wake-up circuit having an output terminal that outputs a switch signal that causes a switch unit to switch a mode of an information processing apparatus to a power-saving mode or a normal mode, a power source terminal connected to a power source, and a connection terminal connected to the power source terminal and the plurality of scan terminals, wherein
  the plurality of voltage dividing resistors have respective resistance values that make voltages of the plurality of sense terminals connected to respective sense ports of the information processing apparatus to a predetermined voltage or less, and
  the wake-up circuit outputs a switch signal from the output terminal to switch the mode to the normal mode when at least one of the plurality of switches is turned on and a potential of the connection terminal is brought into a first level while the information processing apparatus is in the power-saving mode.

2. The key matrix circuit device according to claim 1, further comprising:
  the switch unit;
  a voltage converter connected between the power source and a power source terminal of the information processing apparatus to convert a power source voltage to a voltage that is available for input to the information processing apparatus; and
  a power source switch disposed between the voltage converter and the power source, wherein
  the switch unit causes the power source switch to become conductive when a signal output from the connection terminal is brought into the first level.

3. The key matrix circuit device according to claim 1, further comprising:
  a plurality of logical OR circuits each of which has a plurality of logical OR output terminals connected to the plurality of scan terminals, wherein
  the wake-up circuit includes
    an input terminal that is connected to the information processing apparatus and that receives a status signal representing the mode, and
    a first transistor that has a first current input terminal connected to the connection terminal and the power source terminal, a first current output terminal connected to a reference potential point, and a first control terminal connected to the input terminal, and that is turned on when a signal in a second level is input to the first control terminal,
  the connection terminal is connected to first input terminals of the plurality of logical OR circuits,
  second input terminals of the plurality of logical OR circuits are connected to the plurality of scan ports of the information processing apparatus, and
  the status signal is in the second level when the information processing apparatus is in the normal mode.

4. The key matrix circuit device according to claim 3, wherein the first transistor is turned on when the information processing apparatus enters the normal mode in response to the switch signal, and the wake-up circuit enters a state in which scan of connection statuses of the plurality of switches is available in response to scan signals output from the plurality of scan ports when a potential of the connection terminal is lowered to the first level.

5. The key matrix circuit device according to claim 3, wherein
  the wake-up circuit further has second transistor that includes a second current input terminal connected to the power source terminal, a second current output terminal, and a second control terminal connected to the connection terminal and the first current input terminal and that is turned on when a signal in a first level is input to the second control terminal, and the connection terminal is connected to the power source terminal via the second transistor.

6. The key matrix circuit device according to claim 5, wherein when the information processing apparatus is in the power-saving mode and the plurality of switches are in an off state, a potential of the connection terminal is in the second level.

7. The key matrix circuit device according to claim 5, wherein, when at least one of the plurality of switches is turned on and a potential of the connection terminal is brought into the first level while the information processing apparatus is in the power-saving mode, the second transistor is turned on, so that the wake-up circuit outputs a switch signal for performing switching to the normal mode from the output terminal.

8. The key matrix circuit device according to claim 5, wherein
the wake-up circuit further has a third transistor that has a third current input terminal connected to the output terminal, a third current output terminal connected to the reference potential point, and a third control terminal connected to the second current output terminal, and that is turned on when a signal of the second level is input to the third control terminal,
the output terminal is connected to the power source via a pull-up resistor, and
the switch signal for performing switching to the normal mode is a signal in the first level.

9. The key matrix circuit device according to claim 8, wherein, when at least one of the plurality of switches is turned on and the signal in the first level is input to the second control terminal to turn on the second transistor while the status signal is in the first level indicating the power-saving mode, a potential of the third control terminal is brought into the second level and the third transistor is turned on so that the switch signal is brought into the first level.

10. An input device, comprising:
an operation panel having a plurality of operation units; and
a key matrix circuit device, wherein
the key matrix circuit device includes
a key matrix having a plurality of scan terminals, a plurality of sense terminals, a plurality of switches that are connected between the plurality of scan terminals and the plurality of sense terminals and that are arranged in a matrix, and a plurality of voltage dividing resistors connected between the plurality of sense terminals and the plurality of switches, and
a wake-up circuit having an output terminal that outputs a switch signal that causes a switch unit to switch a mode of an information processing apparatus to a power-saving mode or a normal mode, a power source terminal connected to a power source, and a connection terminal connected to the power source terminal and the plurality of scan terminals,
the plurality of voltage dividing resistors have respective resistance values that make voltages of the plurality of sense terminals connected to respective sense ports of the information processing apparatus to a predetermined voltage or less, and
the wake-up circuit outputs a switch signal from the output terminal to switch the mode to the normal mode when at least one of the plurality of switches is turned on and a potential of the connection terminal is brought into a first level while the information processing apparatus is in the power-saving mode.

11. The input device according to claim 10, further comprising:
the switch unit;
a voltage converter connected between the power source and a power source terminal of the information processing apparatus to convert a power source voltage to a voltage that is available for input to the information processing apparatus; and
a power source switch disposed between the voltage converter and the power source, wherein
the switch unit causes the power source switch to become conductive when a signal output from the connection terminal is brought into the first level.

* * * * *